United States Patent [19]

Takahashi

[11] Patent Number: 5,777,494
[45] Date of Patent: Jul. 7, 1998

[54] SIGNAL DISCRIMINATION CIRCUIT FOR UNKNOWN SIGNAL AMPLITUDE AND DISTORTION

[75] Inventor: Toshiroh Takahashi, Kohnosu, Japan

[73] Assignee: Advantest Corp., Tokyo, Japan

[21] Appl. No.: 627,643

[22] Filed: Apr. 4, 1996

[30] Foreign Application Priority Data

Apr. 4, 1995 [JP] Japan .................................. 7-102957

[51] Int. Cl.$^6$ .......................... G01R 31/28; H03K 5/153
[52] U.S. Cl. .............................................. 327/72; 371/27.7
[58] Field of Search ........................... 327/50, 57, 58, 327/60, 62, 70, 72, 73, 37; 371/5.1, 5.4, 27.1, 27.3, 27.7; 364/486, 487

[56] References Cited

U.S. PATENT DOCUMENTS

| | | | |
|---|---|---|---|
| 4,819,222 | 4/1989 | Kimura | 369/124 |
| 5,430,766 | 7/1995 | Ota et al. | 327/58 |
| 5,463,639 | 10/1995 | Koishi et al. | 371/27.004 |
| 5,508,645 | 4/1996 | Castellucci et al. | 327/58 |
| 5,548,232 | 8/1996 | Yamaura et al. | 327/58 |

*Primary Examiner*—Timothy P. Callahan
*Assistant Examiner*—My-Trang Nu Ton
*Attorney, Agent, or Firm*—Muramatsu & Associates

[57] ABSTRACT

A discrimination circuit discriminates a signal with high stability without being affected by a waveform of the signal to be tested by using an optimum threshold level. The discrimination circuit includes, mark detection means 30 for measuring a mark rate of the signal 100 to be tested for a unit time T0 by applying a threshold level voltage which has a wider voltage range than said signal 100 to a comparator 42 from a DA converter 12, and discrimination control means 20 for specifying an average low level voltage and an average high level voltage based on two points that show abrupt changes in the mark rate in a mark rate distribution obtained by the mark detection means and for calculating a threshold voltage from both of the average low level voltage and the average high level voltage for controlling the DA converter 12 to set the threshold voltage.

4 Claims, 4 Drawing Sheets

SIGNAL DISCRIMINATION CIRCUIT FOR UNKNOWN SIGNAL AMPLITUDE AND DISTORTION

FILED OF THE INVENTION

The present invention relates to a discrimination circuit for a digital signal of an unknown amplitude. In particular, the present invention relates to a discrimination circuit which normalizes a signal having an unknown signal amplitude and wave distortion caused by conditions in a transmission cable to convert the signal to a digital signal.

BACKGROUND OF THE INVENTION

FIG. 4 shows a structure of a conventional signal discrimination circuit 40. FIG. 5 shows an example of an waveform diagram of a signal 100 to be tested which is given to the signal discrimination circuit 40. Here, the signal 100 to be tested is an analog signal of two unknown amplitude values. It is assumed that the signal is generated at the rate of a clock signal 200 and with a substantially constant mark rate pattern. The clock signal 200 and the signal 100 to be tested are coordinated into a desirable timing relation at an input terminal of a flip-flop 44 by a delay circuit 48. The mark rate within this context means a probability of logic "1" in a binary signal sequence wherein logic "1" is termed as a mark, and logic "0" is termed as a space.

The signal discrimination circuit 40 is comprised of a positive peak detector 52, a negative peak detector 54, an adder 56, a comparator 42, a flip-flop 44, and a delay circuit 48.

The positive peak detector 52 detects and integrates positive peak voltages Ppos of the signal 100 to be tested, and provides its output to one input terminal of the adder 56. The negative peak detector 54 detects and integrates negative peak voltages Pneg of the signal 100 to be tested, and provides its output to the other input terminal of the adder 56.

At the adder 56, a voltage Vcmp=½ (Ppos+Pneg), which is a half of two added values, is provided to a negative input terminal of the comparator 42. Hence, an intermediate voltage of the high level and the low level is given to the comparator 42 as a threshold level voltage Vcmp.

The comparator 42 discriminates the signal 100 to be tested by voltage Vcmp and converts the signal to a binary signal which is supplied to a D input terminal of the flip-flop 44. The flip-flop 44 outputs pattern data 120 which has been re-timed and thus normalized by the clock 200.

In the circuit for generating the threshold level voltage Vcmp, there is a possibility that the stable threshold voltage Vcmp cannot be generated. As shown in FIG. 5, when there is an overshot waveform 90, its peak voltage is detected as the high level voltage. As a result, an inaccurate threshold level voltage Vcmp is produced, and thus an accurate operating point of the comparator 42 cannot be attained. Therefore, there is a problem in an actual use that an optimum discriminating operation cannot be expected.

SUMMARY OF THE INVENTION

The present invention is to provide a discrimination circuit that can discriminate an input signal with high stability by an optimum threshold level. The present invention is made in view of the facts that, when a change in mark rate in the input signal 100 is small, a high level and a low level of the signal will be shown as a rapid change of the mark rate when changing a threshold level. The high and low levels are detected by using a sufficiently wider voltage range threshold level than that of the signal 100 to be tested. From this, the high and low voltage levels of the signal 100 to be tested are specified and an optimum threshold level is obtained from this voltage levels.

FIG. 1 shows a first embodiment according to the present invention.

To achieve the above objectives, re-timing means 44 is provided to transmit a signal discriminated at a comparator 42 to a mark rate detector 30 by re-timing the signal with a clock signal 200. A DA converter 12 provides a threshold level voltage which is wider voltage range than the signal 100 to be tested to the comparator 42. The mark rate detector 30 detects the mark rate per unit time. A discrimination controller 20 is provided to specify two points wherein the mark rates change sharply as an average high level voltage and an average low level voltage from the mark rate distribution obtained above. An optimum threshold level voltage Vbest is calculated based on the average high level voltage and the average low level voltage. The optimum threshold voltage is set in the DA converter and is controlled by the discrimination controller 20.

Accordingly, the signal discrimination circuit is realized which can discriminate the signal 100 to be tested with high stability by the optimum threshold level. In this signal discrimination circuit, when receiving the signal 100 having an unknown voltage amplitude, the discrimination circuit provides the optimum threshold level to the comparator 42.

FIG. 2 shows a second embodiment according to the present invention.

The DA converter 12 gives a threshold level voltage which has a wider range than the signal 100 to be tested to the comparator 42. The mark rate detector 30 is provided which detects the mark rate per unit time. The discrimination controller 20 specifies two points wherein the mark rate changes sharply as the average high level voltage and the average low level voltage based on the mark rate distribution obtained above. The optimum threshold level voltage is calculated from those average high level and average low level voltages. The discrimination controller 20 provides the threshold voltage level to the DA converter 12.

In a first example of the mark rate detector 30, there is a structural arrangement wherein an integrator circuit 32 and an AD converter 34 determine the ratio of high and low levels as a mark rate. As for a second example of the mark rate detector 30, there is a structural arrangement wherein the number of generation of high level or low level signals which are re-timed by the clock signal is assigned as the mark rate per unit time.

By counting the number of generation of the high level or low level signals, which are re-timed by the clock signal 200, for every unit time, the mark rate in the current threshold level is obtained. At the mark rate detector 30 wherein the ratio of the high and low levels is determined by the integrator circuit 32 and the AD converter 34, the mark rate is detected with respect to the current threshold level.

In receiving the signal 100 which is provided at an unknown amplitude and mark rate, the discrimination controller 20 controls the DA converter 12 to provide the threshold voltage which is a sufficiently larger voltage range than the amplitude of the signal 100 to the comparator 42. The output of the comparator 42 is examined its mark rate by the mark rate detector 30. This process is repeated by changing the threshold voltages from the DA converter 12 to obtain the mark rate distribution data. From this distribution data, the two points where the mark rate show the sharp changes are specified as an average high level voltage and an average low level. Based on the average voltage levels, the optimum threshold level voltage Vbest is obtained. By setting the optimum threshold voltage by the DA converter 12, the stable signal discrimination operation is performed which will not depend on the waveform conditions of the signal 100 to be tested.

DETAILED DESCRIPTION OF THE INVENTION

An embodiment of the present invention is an example of discrimination circuit which discriminates a signal 100 to be tested when receiving the signal 100 having an unknown voltage that vibrates in a cycle of a clock signal 200. In the present invention, a mark rate is measured by repeatedly changing a threshold level voltage range for a comparator 42 that is sufficiently larger than possible amplitude of the signal 100 to be tested. From the mark rate distribution data thus obtained, high and low level positions are specified. From this, an optimum threshold level voltage (voltage level 85 in FIG. 3) is obtained, which is set as a threshold level. As a consequence, a signal discrimination circuit with high stability is realized.

Figure 1:
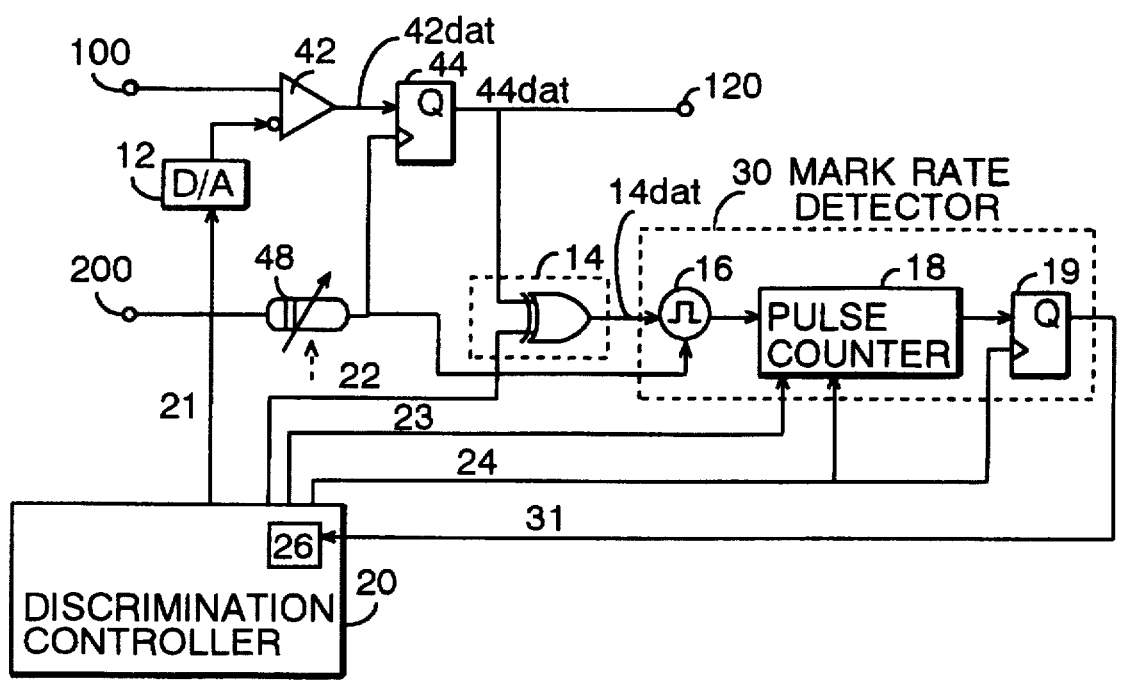
FIG. 1 is an embodiment of discrimination circuit of the present invention that can discriminate at the optimum threshold level.

FIG. 1 shows an embodiment of the discrimination circuit in accordance with the present invention which can discriminate at the optimum threshold level.

It is assumed that the signal 100 to be tested has an unknown amplitude and an unknown constant mark rate. In order to detect the mark rate at the high level of this signal 100 to be tested, a sufficiently low voltage Vmin as a threshold voltage is given, which is consecutively increased its voltage to a sufficiently high voltage Vmax, thereby measuring each mark rate data.

A low level constant signal 22 is provided to one input terminal of a coincidence detection circuit 14 from a discrimination controller 20. A minimum voltage Vmin is set in a DA converter 12 by the discrimination controller 20. Since the voltage is the minimum voltage Vmin, re-timing output data 44dat after the discrimination by a comparator is always at high level. An output signal 14dat, which is obtained by providing the data above to the coincidence circuit 14, is also at high level.

An inner structure of the mark rate detector 30 includes a pulser 16, a pulse counter 18 and a latch register 19.

The pulser 16 receives the above output signal 14dat and convert it to a pulse signal based on the clock signal 200, which is then provided to the clock input terminal of the pulse counter 18 wherein the number of pulse is counted.

The pulse counter 18 is a counter to calculate the input pulse number per unit time. The pulse counter 18 has to have a sufficient bit length, such as 16 bit, to adequately average the mark rate of the bit stream in the signal 100 to be tested.

A count enable signal 23 from the discrimination controller 20 is provided to the pulse counter 18 to count the pulse for a unit time. The counted data is cleared after being latched in the latch register 19 by a load pulse 24. The data latched in the latch register 19 is stored in a memory 26 of the discrimination controller 20 in order. The counter enable signal 23 for the next time unit is sent after the discrimination controller 20 sets the next threshold level voltage to the DA converter 12. These operations are repeated and the count data for each threshold level is obtained.

Similarly, in order to detect the low level mark-rate of the signal 100 to be tested, a high level constant signal 22 is provided from the discrimination controller 20 to one input terminal of the coincidence detection circuit 14. Then, a sufficiently high voltage Vmax is given as a threshold level voltage, and each count data is detected by consecutively decreasing the threshold voltage to the sufficiently low voltage Vmin.

Figure 3:
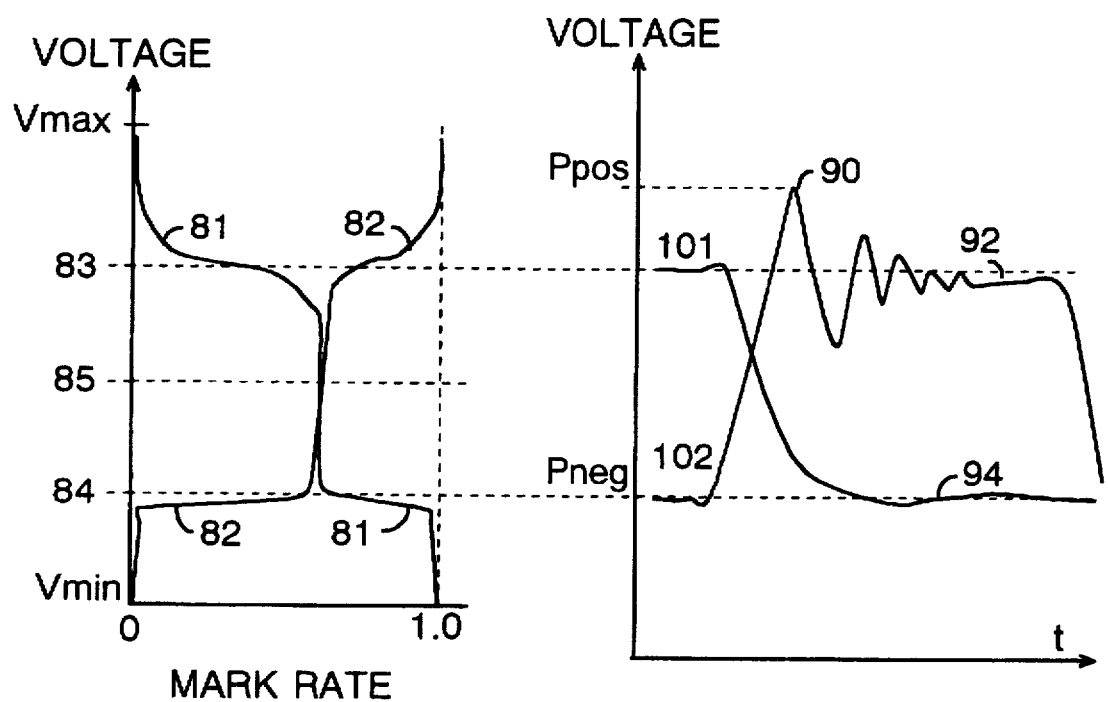
FIG. 3 is a diagram for explaining a mark rate distribution of a signal 100 to be tested.
Figure 4:
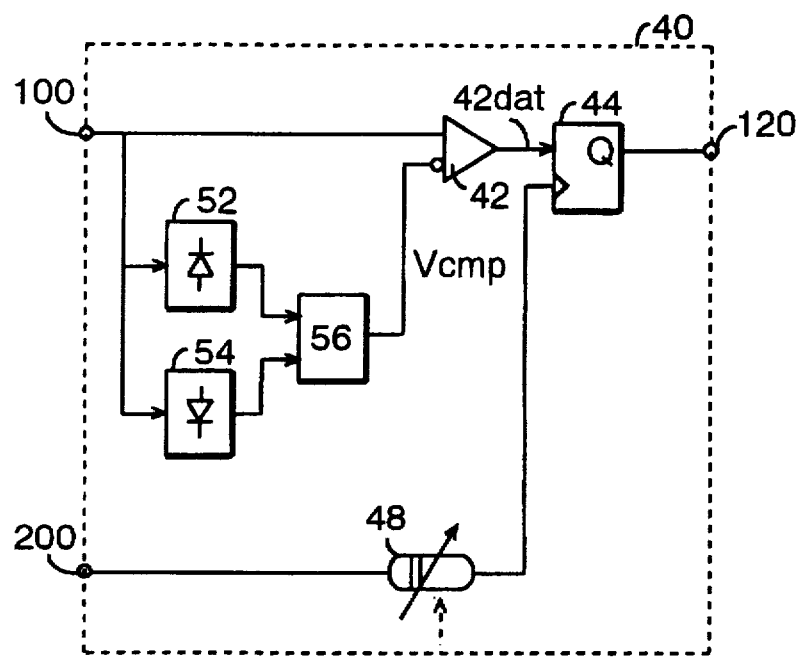
FIG. 4 is an example of conventional signal discrimination circuit 40.
Figure 5:
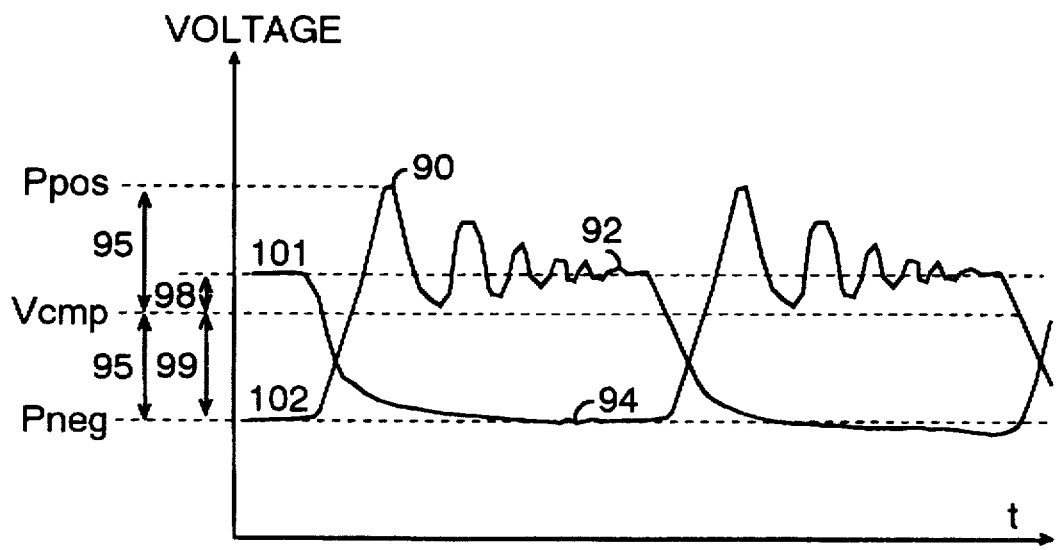
FIG. 5 is an example of input waveform of the signal 100 to be tested having overshoots.

Based on the above procedure, the mark rate is determined by reading the counted data from the memory 26 and divide it by the unit time. Such a mark rate distribution is shown in FIG. 3. The distribution curve 81 is a high level mark rate while the distribution curve 82 is a low level mark rate. In FIG. 3, an electric potential 83 where the mark rate changes sharply is an average high level voltage and an electric potential 84 is recognized as an average low level electric position. An optimum threshold level voltage to be given to the comparator 42 is a voltage level 85 which is a half of the both electric potentials, which is the optimum threshold level voltage.

Hence the discrimination circuit is realized which can discriminate the input signal 100 at the optimum stable threshold level which is not dependent on the waveform of the signal 100 to be tested.

Figure 2:
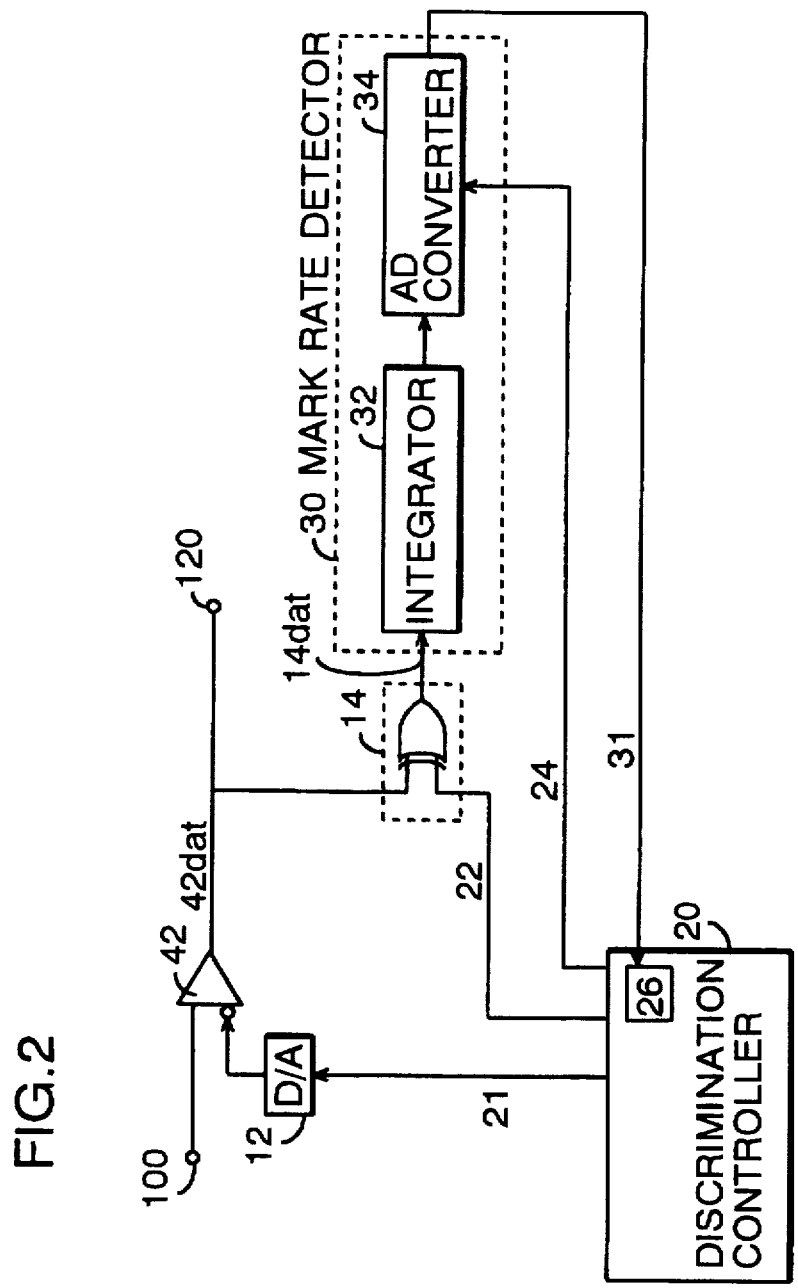
FIG. 2 is an embodiment of discrimination circuit of the present invention in which a mark rate detector 30 is comprised of an integrator circuit and an AD converter.

The above explanation of the embodiment shows the case in which high level mark rate of signal 100 to be tested is detected first and then low level mark rate is detected afterward. However, one mark rate can be determined by the other mark rate through a calculation of 1-(mark rate). In such a case, the coincidence detection circuit 14 can be omitted, and the re-timing output data 44dat in FIG. 2 or the discrimination signal 42dat in FIG. 2 are directly provided to the mark rate detector 30 to implement the similar procedure as above.

The above embodiment explained in the case where the signal 100 to be tested changes at the rate of the clock signal 200, and the flip-flop 44 provides the re-timing output data 44dat to the mark rate detector 30. Even when the signal 100 to be tested changes at the unknown cycle and there is not provided with the clock signal 200 or the flip-flop 44, an integrator circuit 32 and an AD converter 34 can detect a high and low level ratio as a mark rate by a structure of the mark rate detector 30 shown in FIG. 2. Thus, the mark rate distribution is obtained and the optimum threshold level is specified based on the mark rate distribution.

Because of the structure described above, the present invention can achieve following advantages.

By counting the number of generation of the high or low level signal which is re-timed by the clock signal 200 in the unit time, the mark rate at a current threshold level is detected. In the mark rate detector 30 where the integrator circuit 32 and the AD converter 34 determines the high and low level ratio, the mark rate of the current threshold level is detected.

The discrimination circuit receives the signal 100 to be tested which is generated at the unknown amplitude and mark rate. The voltage signal with sufficiently wider range than the signal 100 is given as the threshold level voltage to the comparator 42 by the DA converter. The mark rate is detected at the mark rate detector 30. These operations are repeated while changing the threshold level voltage from the DA converter 12 and the mark rate distribution is obtained. From this distribution data, the two points where the mark rate sharply change are detected as the average high level potential level 83 and the average low level potential 84.

Based on the average high level potential level 83 and the average low level potential 84, the optimum threshold level voltage Vbest will be determined, which realizes the signal discrimination circuit which is independent of the waveform of the signal 100 to be tested.

What is claimed is:

1. A discrimination circuit for discriminating a signal (100) to be tested which has an unknown voltage amplitude by applying a threshold level voltage to a comparator from a DA converter, said discrimination circuit comprising:

mark detection means for measuring a mark rate of said signal (100) to be tested for a unit time by applying said threshold level voltage which has a wider voltage range than said signal (100) to said comparator from said DA converter; and discrimination control means for specifying an average low level voltage of said signal (100) which shows the highest mark rate when said threshold level voltage is in a low voltage range and an average high level voltage of said signal (100) which shows the highest mark rate when said threshold level voltage is in a high voltage range and for calculating an optimum threshold voltage to be set in said DA converter which is an intermediate voltage between said average low level voltage and said average high level voltage;

wherein said mark detection means includes an integrator circuit (32) and an AD converter (34) whereby detecting said mark rate on the basis of a ratio of a high level voltage and a low level voltage of said signal (100).

2. A discrimination circuit as defined in claim 1, wherein an output of said comparator is connected to an input of a coincidence circuit whose other input is supplied with a fixed level logic signal of either a high level or a low level when measuring said mark rate by said mark detection means.

3. A discrimination circuit as defined in claim 2, wherein an output of said coincidence circuit is connected to said integrator circuit (32) whereby output pulse signals from said coincidence circuit are integrated to produce an average voltage which is measured by said AD converter (34) when measuring said mark rate by said mark detection means.

4. A discrimination circuit as defined in claim 3, wherein an output voltage of said AD converter (34) indicates said mark rate of said signal (100), said output voltage of said AD converter (34) being supplied to said discrimination control means wherein said optimum threshold voltage being determined by said average low level voltage and said average high level voltage.

* * * * *